US006809587B2

(12) United States Patent
Ghannouchi et al.

(10) Patent No.: US 6,809,587 B2
(45) Date of Patent: Oct. 26, 2004

(54) ACTIVE PREDISTORTING LINEARIZER WITH AGILE BYPASS CIRCUIT FOR SAFE MODE OPERATION

(75) Inventors: Fadhel Ghannouchi, Mont-Royal (CA); Said Touimer, Montreal (CA); François Beauregard, Laprairic (CA); Chan-Wang Park, Montreal (CA); Ahmed A. Boutouili, Montreal (CA)

(73) Assignee: Mitec Telecom Inc., Quebec (CA)

( * ) Notice: Subject to any disclaimer, the term of this patent is extended or adjusted under 35 U.S.C. 154(b) by 0 days.

(21) Appl. No.: 10/127,722

(22) Filed: Apr. 23, 2002

(65) Prior Publication Data

US 2003/0197559 A1 Oct. 23, 2003

(51) Int. Cl.[7] .............................................. H03F 1/26
(52) U.S. Cl. ...................... 330/149; 330/129; 375/297
(58) Field of Search ................................ 330/149, 151, 330/129, 136; 375/297

(56) References Cited

U.S. PATENT DOCUMENTS 4,412,337 A  * 10/1983  Bickley et al. ............... 375/60
6,255,908 B1 *  7/2001  Ghannouchi et al. ....... 330/149

* cited by examiner

Primary Examiner—Henry Choe
(74) Attorney, Agent, or Firm—Birch, Stewart, Kolasch & Birch, LLP

(57) ABSTRACT

An active predistorting linearizer with agile bypass circuit for safe mode operation is used in conjunction with an amplifier. This linearizer comprises a controllable input variable-attenuator and drive-amplifier circuit supplied with the input signal to attenuate and amplify the input signal. A predistorter includes a controllable phase-shifting and amplitude-adjusting path supplied with the attenuated and amplified input signal to distort the latter signal and produce a predistorted output signal. A controllable output variable-attenuator and drive-amplifier circuit is supplied with the predistorted output signal to attenuate and amplify this predistorted output signal before supplying it to the power amplifier. A phase-shifting and amplitude-adjusting controller is connected to the controllable input variable-attenuator and drive-amplifier circuit, the controllable phase-shifting and amplitude-adjusting path, and the controllable output variable-attenuator and drive-amplifier circuit. Finally, a bypass extends in parallel with the series circuit including the serially interconnected input variable-attenuator and drive-amplifier circuit, controllable phase-shifting and amplitude-adjusting path, and output variable-attenuator and drive-amplifier circuit. This bypass defines a bypass circuit established in response to a fault condition in the series circuit to bypass the faulty series circuit.

10 Claims, 17 Drawing Sheets

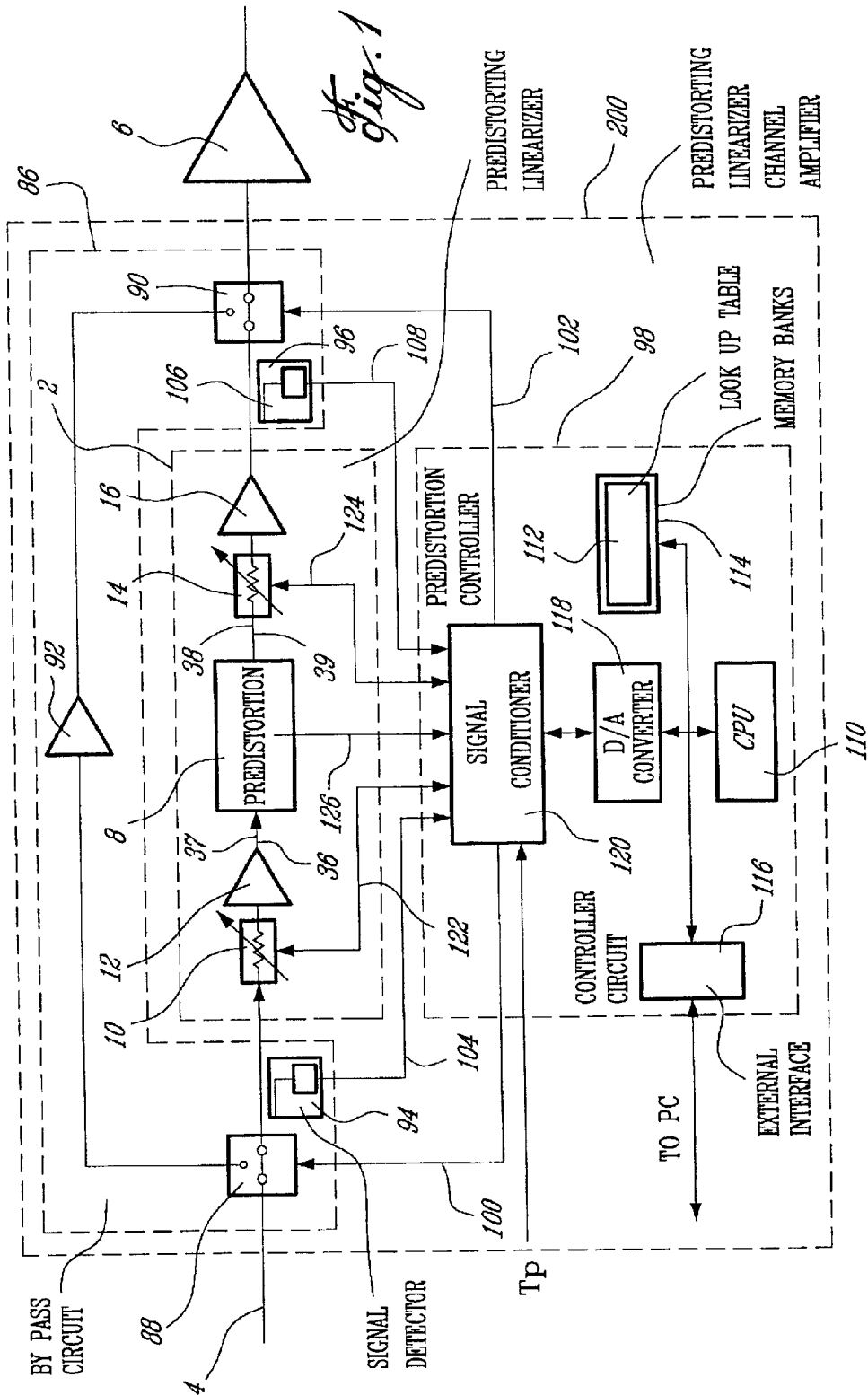

ACTIVE PREDISTORTING LINEARIZER WITH AGILE BYPASS CIRCUIT FOR SAFE MODE OPERATION

FIELD OF THE INVENTION

The present invention relates to a voltage-controlled predistorter that can be used in a predistorting linearizer. The function of the predistorter is to predistort an input signal in view of cancelling a distortion subsequently produced by an amplifier.

BACKGROUND OF THE INVENTION

Microwave power amplifiers (solid state or travelling wave amplifiers) used in ground station transmitters and communication satellites should ideally be highly efficient and provide linear amplification over a wide range of input power. Obviously, the performance of these microwave power amplifiers is limited by the non-linearities of their inner parts or constituents. A wide variety of correction methods for a microwave power amplifier's non-linearities have been proposed and implemented including power back-off, negative feedback, feed forward, etc. However, in most cases the efficiency of the linearized amplifier drops significantly with respect to the efficiency of the non-linearized amplifier specially when the amplifier input is a high crest factor modulated signal such as a CDMA (Code Division Multiple Access), NPR (Noise Power Ratio), or other types of signals.

Predistortion is one of the best cost-effective approaches to reduce the level of non-linear distortion generated by microwave power amplifiers while retaining relatively good power efficiency. Predistortion consists of introducing in the input microwave signal amplitude and phase distortion opposite to the distortion produced by the microwave power amplifier. In this manner, distortion is cancelled to obtain at the output of the power amplifier a signal that is an amplified replica of the input signal with almost no power efficiency decrease. Therefore, the function of a predistorter is to generate both inverse amplitude and phase non-linearity. Since the characteristics of a microwave power amplifier significantly change with temperature, the predistorter has to maintain the overall performance of linearity of the system and to follow the amplifier changes.

OBJECTS OF THE INVENTION

An object of the present invention is therefore to provide a predistorter for use in conjunction with an amplifier for predistorting an input signal in view of cancelling signal distortion subsequently produced by the amplifier.

SUMMARY OF THE INVENTION

More specifically, In accordance with the present invention, there is provided a predistorter for predistorting a RF signal subsequently injected in an amplifier, comprising:
 a hybrid coupler comprising a RF input constituting an input of the predistorter supplied with the RF signal, a RF output constituting an output of the predistorter for supplying a predistorted version of the RF signal, a direct port, and a coupled port;
 a first semiconductor component connected between the direct port and the ground;
 a second semiconductor component connected between the coupled port and the ground; and
 a controllable biasing-voltage supply connected to the first and second semiconductor components, thereby supplying the first and second semiconductor components with a controllable biasing voltage.

In operation, the predistorter produces a controllable predistortion of the RF signal related to the controllable biasing voltage to cancel a distortion subsequently produced by the amplifier.

In accordance with the present invention, there is also provided a predistorting linearizer channel amplifier for processing a RF signal subsequently injected in an amplifier, comprising:
 a controllable input variable-attenuator and drive-amplifier circuit supplied with the RF signal to attenuate and amplify the RF signal;
 the above described predistorter supplied with the attenuated and amplified RF signal to produce a predistorted RF signal;
 a controllable output variable-attenuator and drive-amplifier circuit supplied with the predistorted RF signal to attenuate and amplify the predistorted RF signal before supply of the predistorted RF signal to the amplifier; and
 a controller connected to the controllable input variable-attenuator and drive-amplifier circuit, the biasing-voltage supply, and the controllable output variable-attenuator and drive-amplifier circuit, this controller embodying a phase-shifting and amplitude-adjusting control function applied to the controllable input variable-attenuator and drive-amplifier circuit, the controllable biasing-voltage supply, and the controllable output variable-attenuator and drive-amplifier circuit in order to produce a predistortion of the RF signal which cancels a distortion subsequently produced by the amplifier.

In accordance with the present invention, there is also provided a predistorter for predistorting a RF signal subsequently injected in an amplifier, comprising:
 a hybrid coupler comprising a RF input constituting an input of the predistorter supplied with the RF signal, a RF output constituting an output of the predistorter for supplying a predistorted version of the RF signal, a direct port, and a coupled port;
 a first diode having an anode connected to the direct port and a cathode connected to the ground;
 a second diode having an anode connected to the coupled port and a cathode connected to the ground; and
 a controllable biasing-voltage supply connected to the direct port and to the coupled port, thereby supplying the direct and coupled ports with a controllable biasing voltage.

In operation, the predistorter produces a controllable predistortion of the RF signal related to the controllable biasing voltage to cancel a distortion subsequently produced by the amplifier.

In accordance with the present invention, there is further provided a predistorter for predistorting a RF signal subsequently injected in an amplifier, comprising:
 a hybrid coupler comprising a RF input constituting an input of the predistorter supplied with the RF signal, a RF output constituting an output of the predistorter for supplying a predistorted version of the RF signal, a direct port, and a coupled port;
 first and second diodes connected between the direct port and the ground, the first and second diodes being connected in head to tail configuration;
 third and fourth diodes connected between the direct port and the ground, the third and fourth diodes being connected in head to tail configuration; and a controllable biasing-voltage supply connected to the direct port and to the coupled port, thereby supplying the direct and coupled ports with a controllable biasing voltage.

In operation, the predistorter produces a controllable predistortion of the RF signal related to the controllable biasing voltage to cancel a distortion subsequently produced by the amplifier.

The present invention still further relates to a predistorter for predistorting a RF signal subsequently injected in an amplifier, comprising:

- a hybrid coupler comprising a RF input constituting an input of the predistorter supplied with the RF signal, a RF output constituting an output of the predistorter for supplying a predistorted version of the RF signal, a direct port, and a coupled port;
- a first diode having an anode connected to the direct port and a cathode connected to the ground;
- a first matching circuit and a second diode connected in series between the direct port and the ground, the second diode having a cathode connected to the ground;
- a third diode having an anode connected to the coupled port and a cathode connected to the ground;
- a second matching circuit and a fourth diode connected in series between the coupled port and the ground, the fourth diode having a cathode connected to the ground; and
- a controllable biasing-voltage supply connected to the direct port and the coupled port, thereby supplying the direct and coupled ports with a controllable biasing voltage.

In operation, the predistorter produces a controllable predistortion of the RF signal related to the controllable biasing voltage to cancel a distortion subsequently produced by the amplifier.

Still in accordance with the present invention, there is provided a predistorter for predistorting a RF signal subsequently injected in an amplifier, comprising:

- a hybrid coupler comprising a RF input constituting an input of the predistorter supplied with the RF signal, a RF output constituting an output of the predistorter for supplying a predistorted version of the RF signal, a direct port, and a coupled port;
- a first transistor connected between the direct port and the ground;
- a second transistor connected between the coupled port and the ground; and
- a controllable biasing-voltage supply connected to the first transistor and the second transistor, thereby supplying the first and second transistors with a controllable biasing voltage.

In operation, the predistorter produces a controllable predistortion of the RF signal related to the controllable biasing voltage to cancel a distortion subsequently produced by the amplifier.

According to the present invention, there is further provided a predistorting linearizer channel amplifier for processing an input signal subsequently supplied to a power amplifier, comprising:

- a controllable input variable-attenuator and drive-amplifier circuit supplied with the input signal to attenuate and amplify the input signal;
- a predistorter comprising a controllable phase-shifting and amplitude-adjusting path supplied with the attenuated and amplified input signal to distort the attenuated and amplified input signal and produce a predistorted output signal;
- a controllable output variable-attenuator and drive-amplifier circuit supplied with the predistorted output signal to attenuate and amplify the predistorted output signal before supplying the predistorted output signal to the power amplifier;
- a phase-shifting and amplitude-adjusting controller connected to the controllable input variable-attenuator and drive-amplifier circuit, the controllable phase-shifting and amplitude-adjusting path, and the controllable output variable-attenuator and drive-amplifier circuit; and
- a bypass extending in parallel with the series circuit including the serially interconnected input variable-attenuator and drive-amplifier circuit, controllable phase-shifting and amplitude-adjusting path, and output variable-attenuator and drive-amplifier circuit, the bypass defining a bypass circuit established in response to a fault condition in the series circuit to bypass the faulty series circuit.

The foregoing and other objects, advantages and features of the present invention will become more apparent upon reading of the following non-restrictive description of illustrative embodiments thereof, given by way of example only with reference to the accompanying drawings.

BRIEF DESCRIPTION OF THE DRAWINGS

In the appended drawings:

FIG. 1 is a schematic block diagram of an illustrative embodiment of a predistorting linearizer channel amplifier according to the invention, with an agile bypass circuit;

DETAILED DESCRIPTION OF THE ILLUSTRATIVE EMBODIMENTS

Figure 2A:
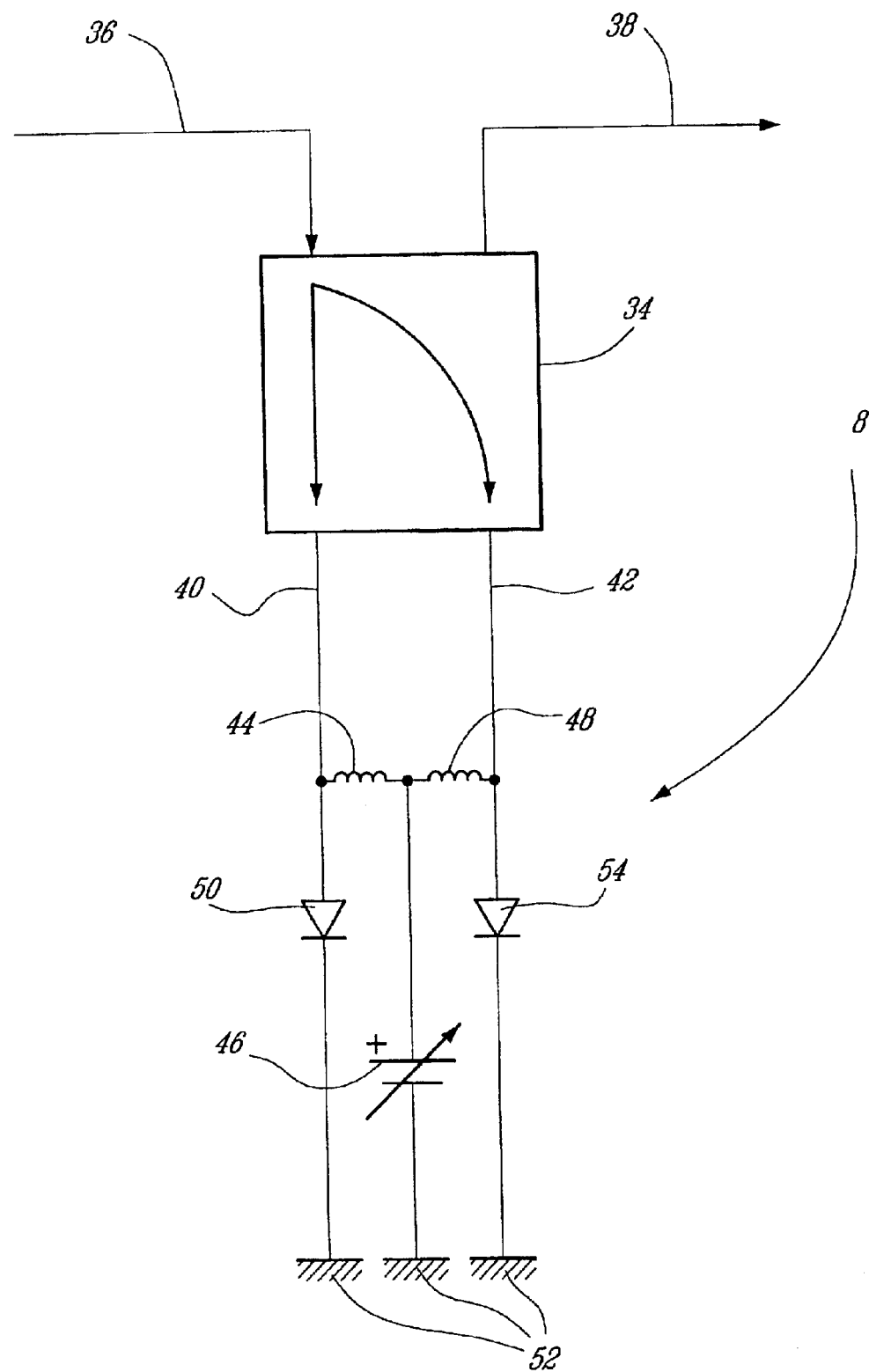
FIG. 2a is a circuit diagram of a first illustrative embodiment of a voltage-controlled predistorter according to the present invention, forming part of a predistorting linearizer section of the predistorting linearizer channel amplifier of FIG. 1.

Referring to FIG. 1, the predistorting linearizer channel amplifier 200 principally comprises a predistorting linearizer section 2 and a predistortion controller 98. An agile bypass can also be provided for. These will be described in detail herein below.

(a) The Predistorting Linearizer Section

The predistorting linearizer section 2 of the illustrative embodiment of FIG. 1 is a non-linear correcting circuit which intentionally introduces a predistortion in a signal, for example a high amplitude RF input signal 4. This predistortion will cancel a distortion subsequently produced by a power amplifier 6 without compromising the efficiency of this power amplifier close to saturation. In the illustrative embodiment of FIG. 1, the high amplitude input signal 4 is a high crest factor modulated signal. The power amplifier 6 can be, for example, a Solid State Power Amplifier (SSPA) or a Travelling Wave Tube Amplifier (TWTA) although it will be apparent to those of ordinary skill in the art that the predistorting linearizer section 2 may be used with a variety of types of amplifiers.

The predistorting linearizer section 2 comprises a controllable input variable-attenuator and drive-amplifier circuit including serially interconnected variable attenuator 10 and input drive amplifier 12. The serially interconnected variable attenuator 10 and input drive amplifier 12 attenuate and amplify the input signal 4, and this attenuated and amplified signal 37 is supplied to a predistorter 8. In this manner, the amplitude of the input signal 4 is controlled to thereby control the moment when the predistorter 8 begins to compress or expand signal 37.

The predistorter 8 produces a non-linear distortion of the signal 37 from the input drive amplifier 12 and adjusts the total power compression or expansion of this signal 37. As will be seen in the following description, the predistorter 8 includes Schottky diodes or terminated transistors (MESFET, BJT, HBT, PHMET etc.) requiring a minimum level of signal to proceed with compression or expansion of the signal. The predistortion introduced in terms of phase and amplitude varies in accordance with a controllable biasing voltage applied to the predistorter 8.

Since the output power at saturation of the non-predistorted power amplifier (PA) 6 and the predistorted power amplifier (PPA) 6 must be substantially the same, the predistorting linearizer section 2 also comprises a controllable output variable-attenuator and drive-amplifier circuit including serially interconnected variable attenuator 14 and drive amplifier 16 to match the output level range of the predistorter 8 to the input level range of the power amplifier 6.

Therefore, in view of the above description, the predistorting linearizer section 2 is controllable through the following three (3) components:

the gain of the controllable input variable-attenuator and drive amplifier circuit including the serially interconnected variable attenuator 10 and drive amplifier circuit 12, referred to as the input gain;

the gain of the controllable output variable-attenuator and drive-amplifier circuit including the serially interconnected variable attenuator 14 and drive amplifier circuit 16, referred to as the output gain; and the biasing voltage of the predistorter 8.

(a.1) The Attenuators

The attenuators are well known in the art and may be purchased of the shelf, for example as Variable Voltage Attenuator (VVA) available from all major RF equipment manufacturers. They will not be discussed here.

(a.2) The Predistorter

As shown in FIGS. 2a, 2b, 2c, 2d and 2e, when the power amplifier 6 is a microwave power amplifier, the predistorter 8 can comprise of a hybrid coupler 34 having a RF input 36 constituting the input of the predistorter 8 supplied with the attenuated and amplified RF signal 37, a RF output 38 constituting the output of the predistorter 8 for supplying a predistorted version 39 of the RF signal 37, a direct port 40 and a coupled port 42.

In the example of FIG. 2a, a first inductor 44 is connected between the direct port 40 and a controllable voltage source 46. A second inductor 48 is connected between the coupled port 42 and the controllable biasing-voltage supply 46. A first Schottky diode 50 has a cathode connected to the ground 52 and an anode connected to the direct port 40. A second Schottky diode 54 has an anode connected to the coupled port 42 and a cathode connected to the ground 52. The controllable biasing-voltage supply 46 supplies diodes 50 and 54 with a controllable biasing voltage via the inductors 44 and 48, respectively. Just a word to mention that, in operation, the predistorter 8 produces a controllable predistortion of the RF signal related to the controllable biasing voltage to cancel a distortion subsequently produced by the microwave power amplifier 6.

Figure 2B:
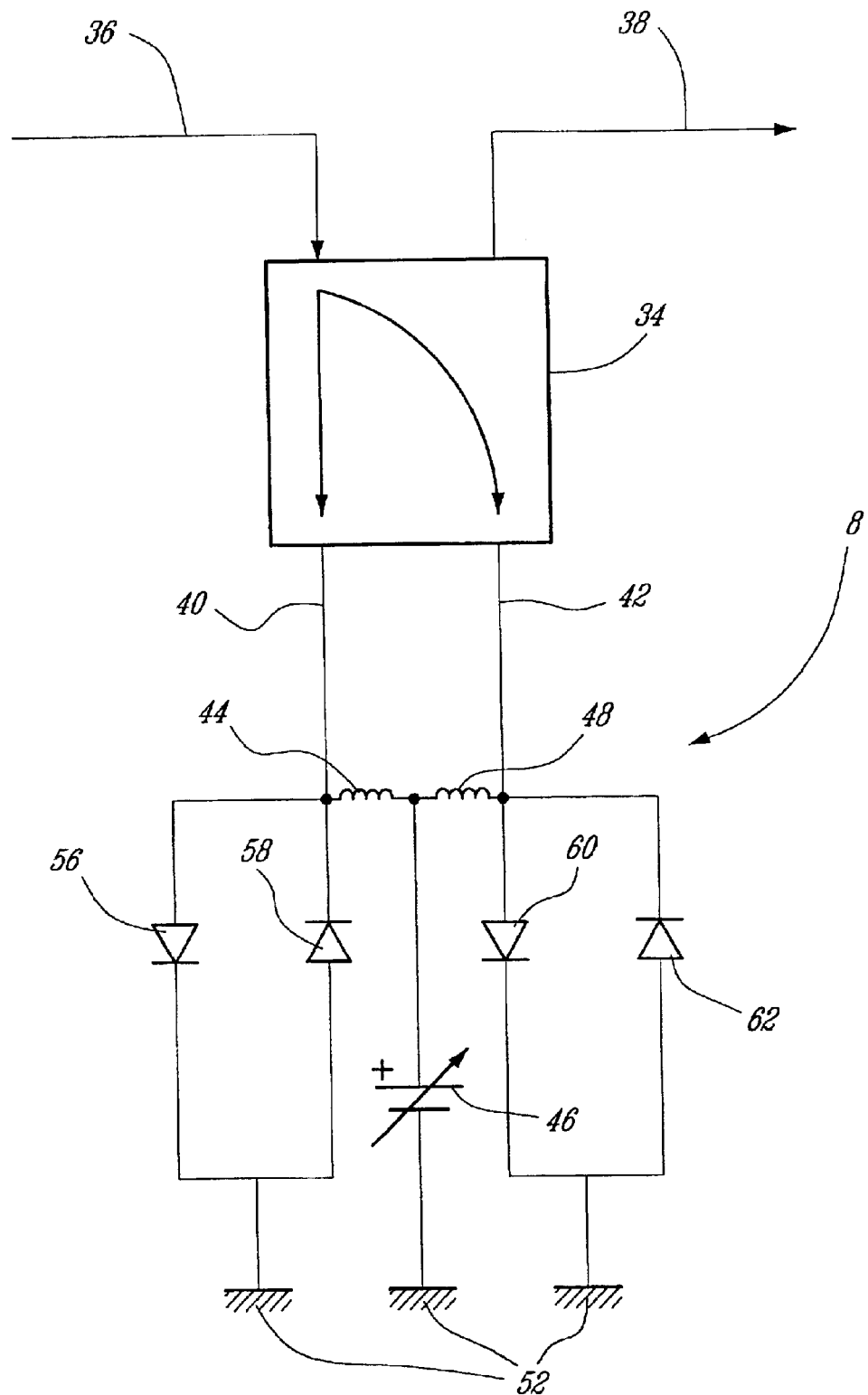
FIG. 2b is a circuit diagram of a second illustrative embodiment of a voltage-controlled predistorter according to the present invention, forming part of the predistorting linearizer section of the predistorting linearizer channel amplifier of FIG. 1.

Referring now to FIG. 2b, the first inductor 44 is connected between the direct port 40 and the controllable biasing-voltage source 46. The second inductor 48 is connected between the coupled port 42 and the controllable biasing-voltage supply 46. Schottky diodes 56 and 58 are connected in a head-to-tail configuration between the direct port 40 and the ground 52. Schottky diodes 60 and 62 are connected in a head-to-tail configuration between the coupled port 42 and the ground 52. The controllable biasing-voltage supply 46 is connected via the first and second inductors 44 and 48 to the direct port 40 and the coupled port 42, respectively, thereby supplying the diodes 56, 58 and 60, 62 with a controllable biasing voltage. In operation, the predistorter 8 produces a controllable predistortion of the RF signal 37 related to the controllable biasing voltage to cancel a distortion subsequently produced by the microwave power amplifier 6.

Figure 2C:
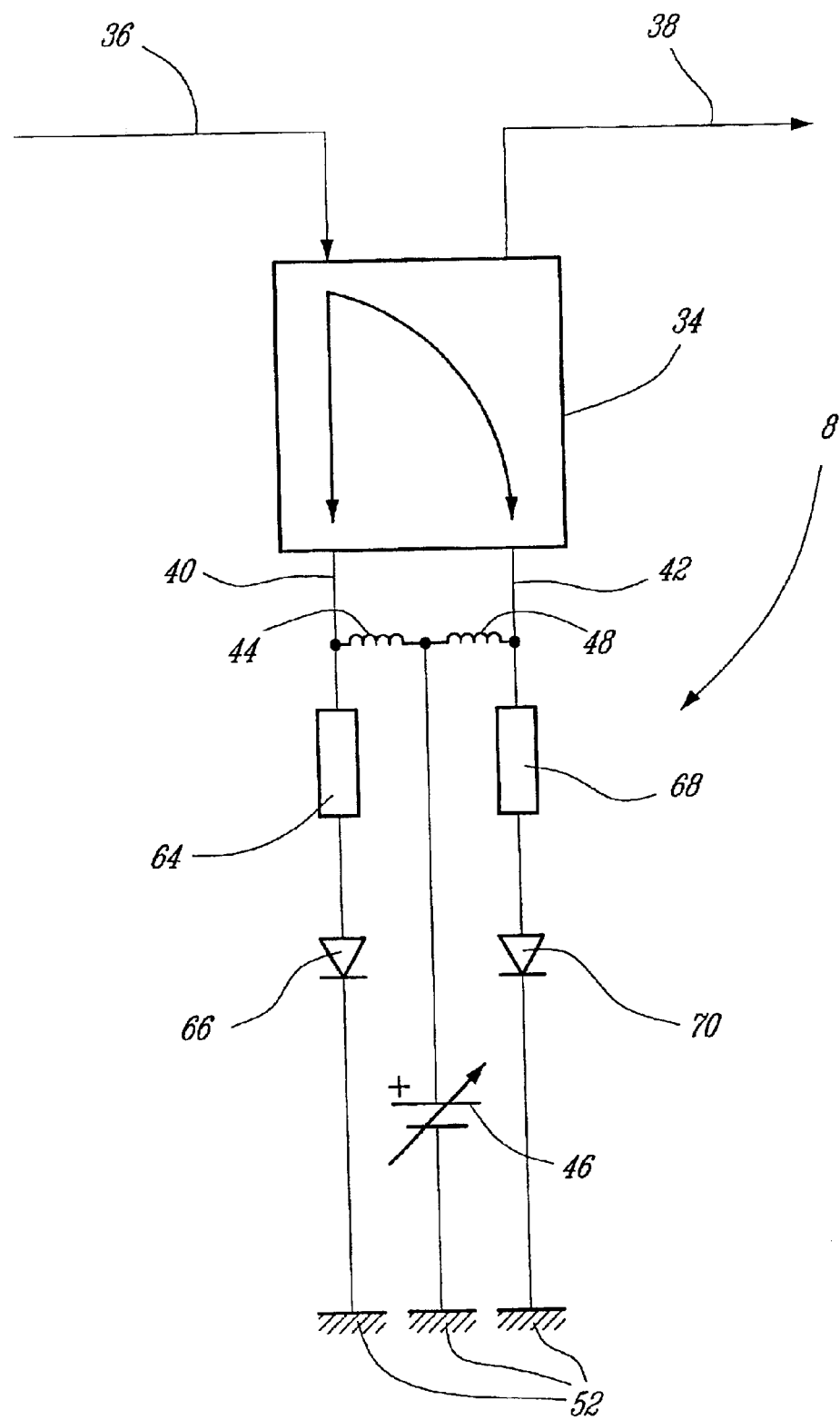
FIG. 2c is a circuit diagram of a third illustrative embodiment of a voltage-controlled predistorter according to the present invention, forming part of the predistorting linearizer section of the predistorting linearizer channel amplifier of FIG. 1.

In the example of FIG. 2c, the first inductor 44 is connected between the direct port 40 and the controllable voltage source 46. The second inductor 48 is connected between the coupled port 42 and the controllable biasing-voltage supply 46. A line matching circuit 64 is connected between the direct port 42 and the anode of a first Schottky diode 66. Similarly, a line matching circuit 68 is connected between the coupled port 42 and the anode of a second Schottky diode 70. Both the first and second Schottky diodes 66 and 70 have their cathodes connected to the ground 52. Via the first and second inductors 44 and 48 and the first and second line matching circuits 64 and 68 the controllable biasing-voltage supply 46 supplies the diodes 66 and 70 with a controllable biasing voltage.

In operation, the predistorter 8 produces a controllable predistortion of the RF signal 37 related to the controllable biasing voltage to cancel a distortion subsequently produced by the microwave power amplifier 6.

Figure 2D:
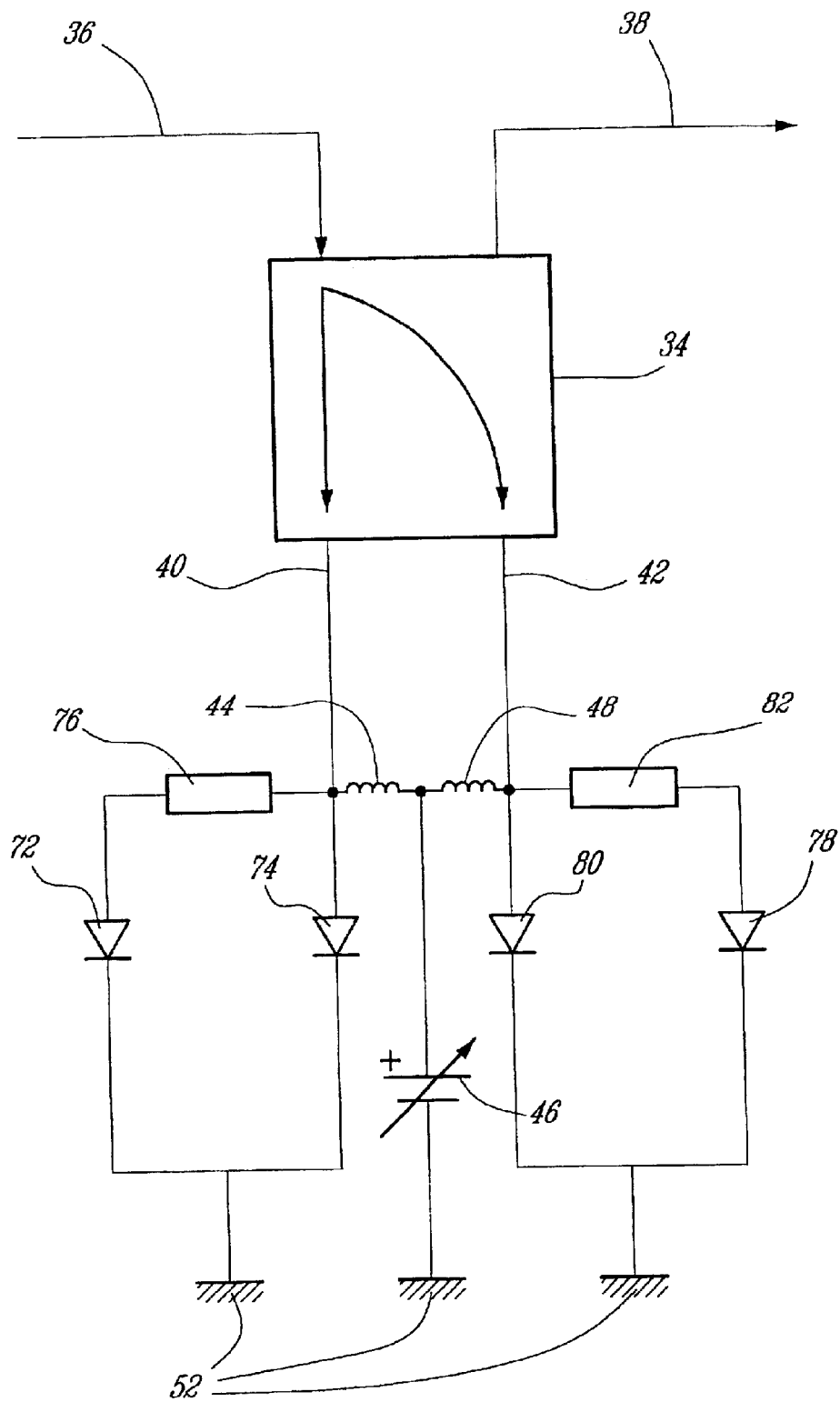
FIG. 2d is a circuit diagram of a fourth illustrative embodiment of a voltage-controlled predistorter according to the present invention, forming part of the predistorting linearizer section of the predistorting linearizer channel amplifier of FIG. 1.

Referring now to FIG. 2d, the first inductor 44 is connected between the direct port 40 and the controllable voltage source 46. The second inductor 48 is connected between the coupled port 42 and the controllable biasing-voltage supply 46. First and second Schottky diodes 72 and 74 have their cathodes connected to the ground 52. A first line matching circuit 76 is interposed between the anode of the diode 72 and the direct port 40. Similarly, third and fourth Schottky diodes 78 and 80 have their cathodes connected to the ground 52. A second line matching circuit 82 is interposed between the anode of the diode 78 and the coupled port 42. Via the first and second inductors 44 and 48, the controllable biasing-voltage supply 46 supplies diodes 72, 74, 78 and 80 with a controllable biasing voltage.

Figure 2E:
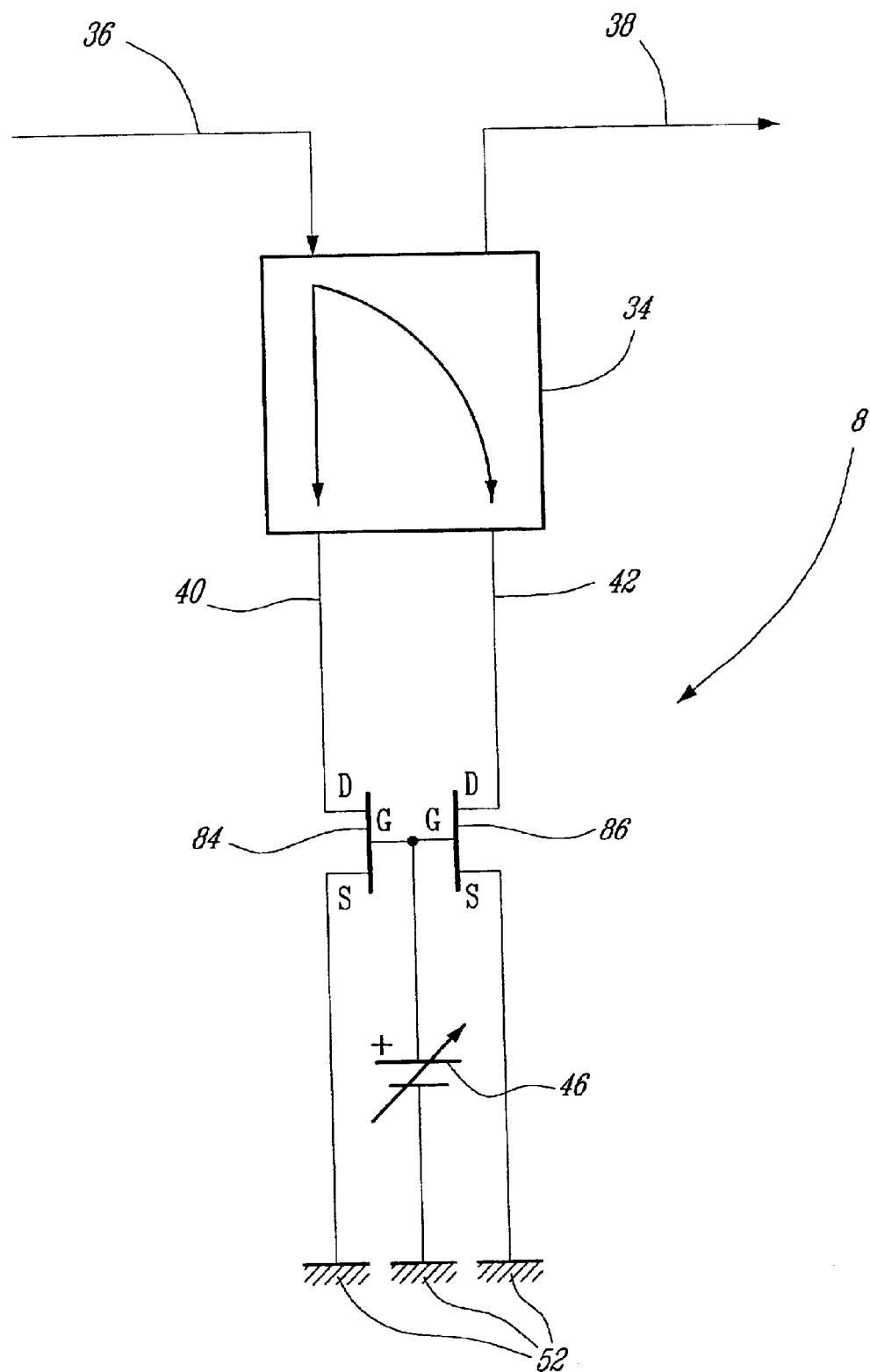
FIG. 2e is a circuit diagram of a fifth illustrative embodiment of a voltage-controlled predistorter according to the present invention for use in the predistorting linearizer section of the predistorting linearizer channel amplifier of FIG. 1.

Finally, in the embodiment of FIG. 2e, two terminated biased transistors 84 and 86 are connected between the direct port 40 or coupled port 42 and the ground 52. More specifically the source of the first transistor 84 is connected to the direct port 40 and the drain of the first transistor 84 is connected to the ground 52. Similarly, the source of the second transistor 86 is connected to the coupled port 42 and the drain of the second transistor 86 is connected to the ground 52. The controllable biasing-voltage supply 46 is connected to the gates of the first and second transistors 84 and 86 thereby supplying both transistors with a controllable biasing voltage.

In operation, the predistorter 8 still produces a controllable predistortion of the RF signal 37 related to the controllable biasing voltage to cancel a distortion subsequently produced by the microwave power amplifier 6.

The transistors 84 and 86 can be terminated transistors selected from the group consisting of: MESFET transistors; BJT transistors, HBT transistors; PHMET transistors; etc.

The choice of a predistorter configuration depends on the kind of power amplifier 6 for which the input signal 4 is to be predistorted. An initial criterion is the total gain distortion (compression or expansion, AM/AM distortion) and phase shift variation (advance or lag, AM/PM distortion) of the power amplifier 6. The adjustment of the predistorter parameters is required to fit the ideal predistortion curves as detailed below.

In the predistorting linearizer section 2, gain and phase may be distorted through controllable biasing of the attenuators 10 and 14 and the predistorter 8. Controllable biasing of these circuits is carried out though control of the controllable biasing-voltage supply 46.

Figure 8A:
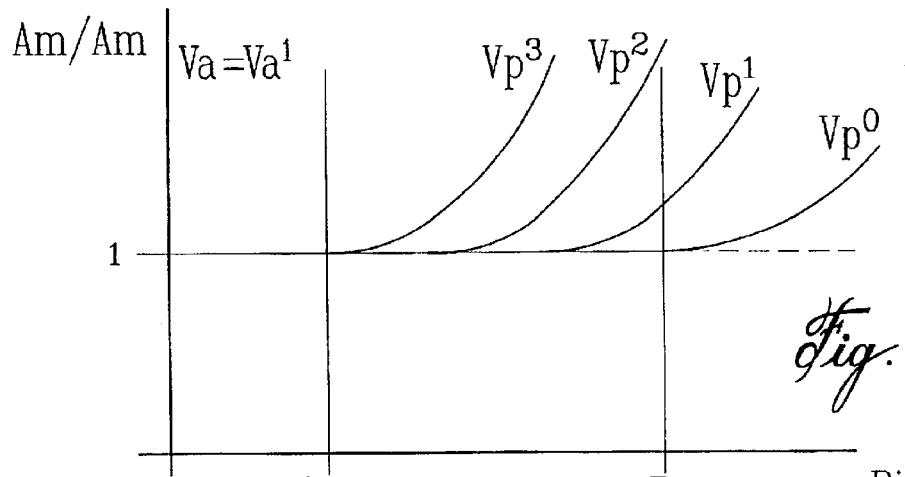
FIG. 8a is a graph showing typical AM/AM curves for a predistorting linearizer channel amplifier with varying biasing voltages $V_p$.

FIG. 8a shows curves representing the normalised ratio of the amplitude of the output signal 39 of the predistorter 8 over the amplitude of the input signal 37 to the predistorter 8 (AM/AM) versus the input power $P_{in}$. By increasing the biasing voltage $V_p$ of the controllable biasing-voltage supply 46 of the predistorter 8 as disclosed in FIGS. 2a–e, the input signal is expanded at a lower drive level (input power), causing the ratio of the normalised amplitude of the output signal 39 over the amplitude of the input signal 37 to increase as shown in FIG. 8a.

This property of the predistorter can be used as a software bypass by setting the biasing voltage $V_p$ below an operational threshold, typically 0V. In this condition the predistorter does not produce a controllable predistortion (i.e. it does not expand the input signal) over a wide input drive level $P_{in}$.

Figure 8B:
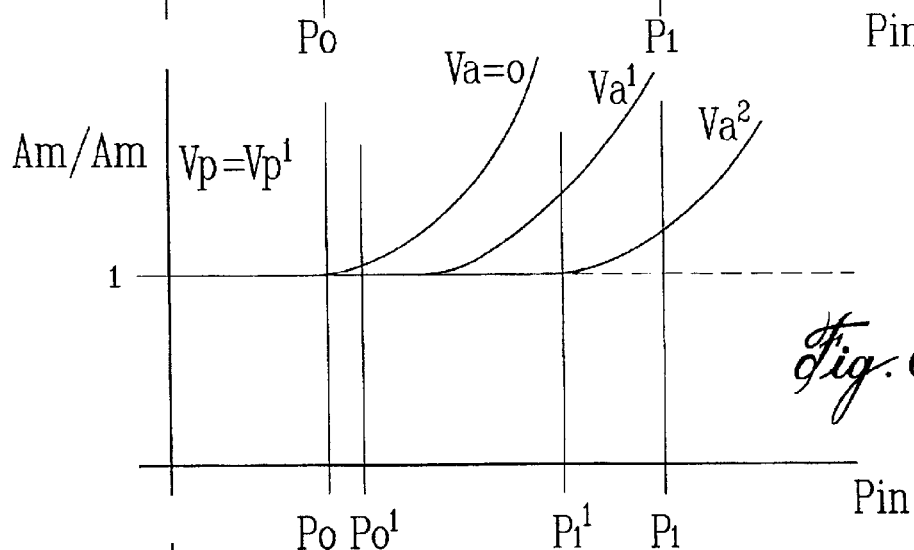
FIG. 8b is a graph showing typical AM/AM curves for a predistorting linearizer channel amplifier with varying biasing voltages $V_a$.

FIG. 8b illustrates curves representing the ratio of the normalised amplitude of the input signal to the power amplifier 6 over the amplitude of the input signal 37 to the predistorter (AM/AM) versus the input power $P_{in}$. By increasing the biasing voltage $V_a$ to the variable attenuator 14 the power level $P_{in}$ at which the input signal to the power amplifier 6 begins to stray from the input signal 37 to the predistorter 8 (referred to as the "knee" on the diagram) can be adjusted.

Figure 8C:
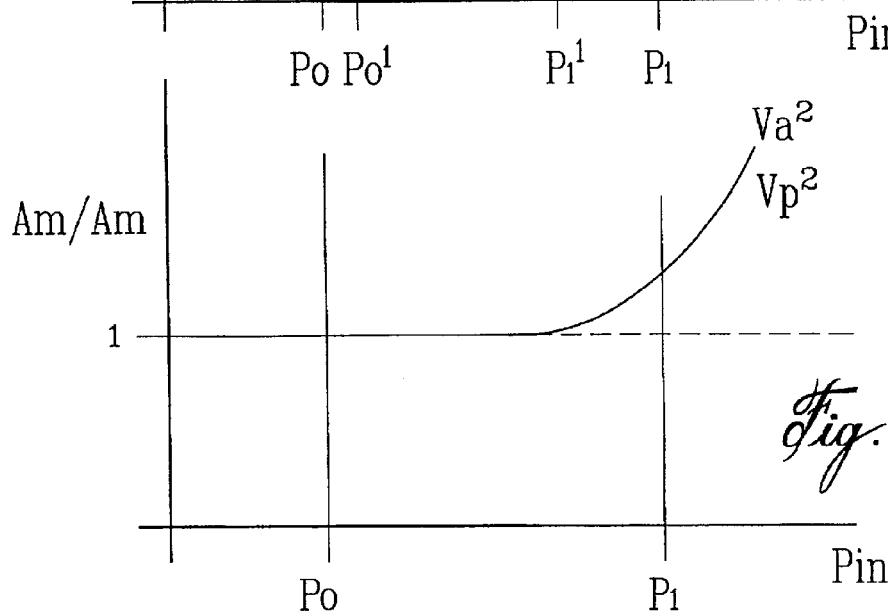
FIG. 8c is a graph showing typical AM/AM curves for a predistorting linearizer channel amplifier illustrating the effect of varying both biasing voltages $V_p$ and $V_a$.

Referring now to FIG. 8c, this Figure illustrates curves representing the normalised ratio of the amplitude of the input signal to the power amplifier 6 over the amplitude of the input signal 4 (AM/AM) versus the input power $P_{in}$. By combining the effects of the biasing voltage $V_p$ to the predistorter 8 and the biasing voltage $V_a$ to the variable attenuator 14 the input signal to the power amplifier 6 can be optimally predistorted to compensate for distortion introduced by the power amplifier 6 at high amplitudes.

Figure 8D:
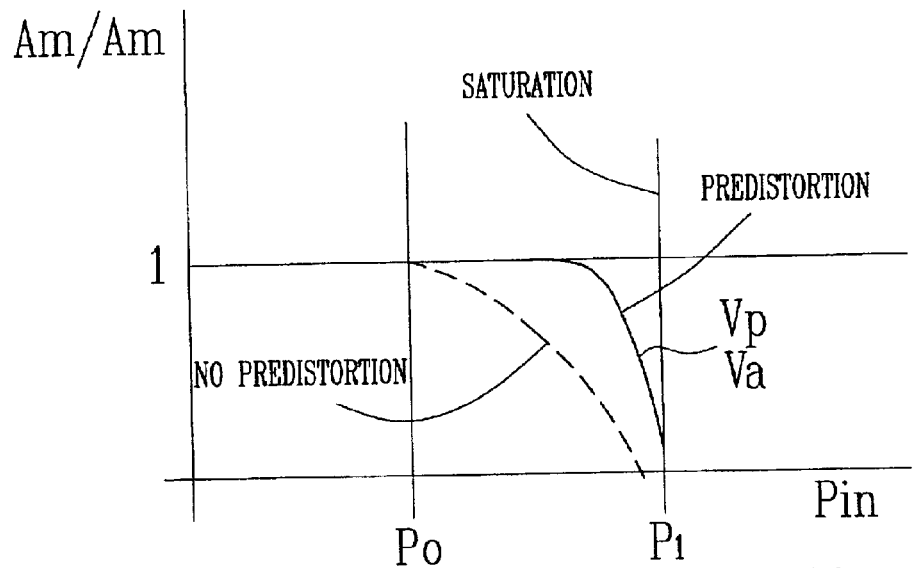
FIG. 8d is a graph showing typical AM/AM curves for both a predistorted and unpredistorted power amplifiers.

Referring now to FIG. 8d, curves representing the normalised ratio of the amplitude of the output signal from the power amplifier 6 over the amplitude of the input signal 4 (AM/AM) versus the input power $P_{in}$ are disclosed for both predistorted and unpredistorted signals. At input power level $P_0$ the non-predistorted power amplifier 6 begins to compress input signals, thereby causing the output power to decrease nonlinearly relative to the input power. Further increase in $P_{in}$ eventually causes the amplifier to saturate at $P_1$. By driving the power amplifier with a predistorted signal, the amplified output signal remains in a linear relationship with the input signal at higher input signal amplitudes. Typically, for a given power amplifier 6 operating at a given temperature, single values of $V_p$ and $V_a$ are necessary to insure adequate predistortion.

Figure 8E:
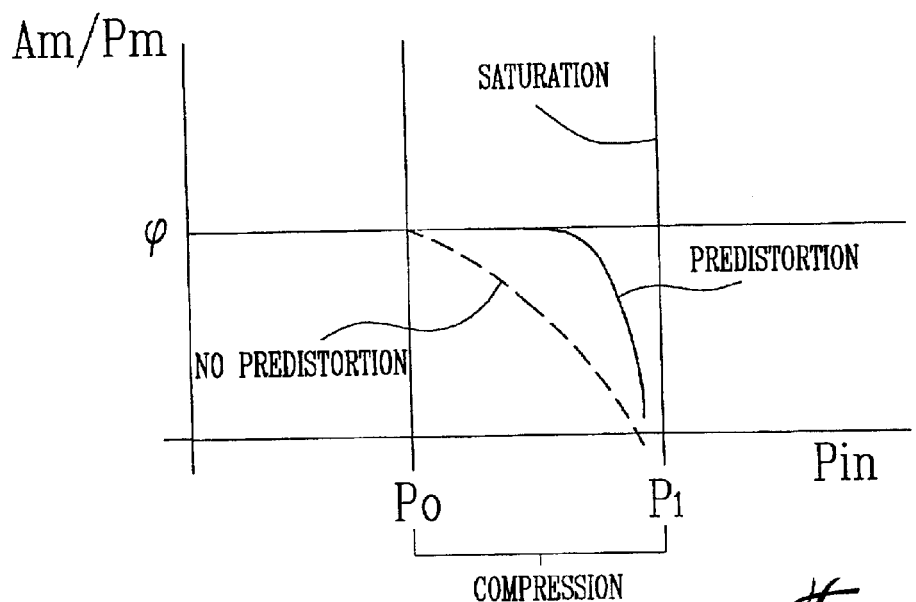
FIG. 8e is a graph showing typical AM/PM curves for both a predistorted and unpredistorted power amplifiers.

FIG. 8e show curves representing a typical input power versus output phase shift (AM/PM) for a predistorted and non-predistorted power amplifier 6. Similar to the amplitude of the output signal from the power amplifier 6, as the input power $P_{in}$ is steadily increased eventually the power amplifier 6 begins to saturate causing the output signal to be phase-shifted relative to the input signal. Referring back to FIG. 8d in addition to FIG. 8e, by raising accordingly the voltage $V_p$ of the controllable biasing-voltage supply 46 of the predistorter 8 as disclosed in FIGS. 2a–e, the phase of the input signal can be shaped to compensate for the non-linear phase shift variation of the power amplifier 6 such that the phase of the output signal from the power amplifier 6 remains in a steady relationship with the phase of the input signal 4 at higher input signal amplitudes.

(b) The Bypass Circuit

Referring back to FIG. 1, communication systems and in particular those which are satellite based generally have additional requirements in terms of increased tolerance to faults which must be met before the system can be placed in full service. In order to meet these requirements an agile bypass 86 is included which allows the predistorting linearizer section 2 to be bypassed in cases of fault or failure of the predistorting linearizer section 2 including the attenuator 10, the input drive amplifier 12, the predistorter 8, the attenuator 14 and the output drive amplifier 16. Alternatively, since the power amplifier 6 operates linearly when operated with low input signal levels, the predistorting linearizer section 2 is inactive for input signals 4 of amplitudes which would not drive the power amplifier 6 into compression, and therefore the predistorting linearizer section 2 may also be bypassed using the agile bypass 86 under such circumstances.

According to the example of FIG. 1, the agile bypass 86 comprises an input switch 88, an output switch 90 and a circuit formed by a compensation amplifier 92 such that a small signal gain of the agile bypass circuit equals a small signal gain of the predistortion circuit. An input signal detector 94 and output signal detector 96 complete the circuit.

Control of the input switch 88 and the output switch 90 is provided by the controller circuit 98 via a control line 100 and a control line 102, respectively. The decision to use the agile bypass 86 is based on (i) the level of the input signal 4 as detected by the input signal detector 94 and supplied to the controller circuit 98 via line 104, and (ii) the level of the output signal 106 from the output drive amplifier 16 as detected by the output signal detector 96 and supplied to the controller circuit 98 via line 108.

For example, a processor 110 of the controller circuit 98 detects a failure of the predistorting linearizer section 2 and therefore decides to use the agile bypass 86 on the basis of a comparison of the signal levels measured through the input signal detector 94, the output signal detector 96, a signal conditioner 120 and a digital-to-analog (D/A) converter 118. When the difference between the levels is not substantially equal to a pre-calibrated value, for example 5 dB, a fault condition will be assumed to have been detected and the predistorting linearizer section 2 bypassed through the agile bypass 86. Note that the difference between levels may vary with the temperature of operation of the power amplifier 6 and therefore values must be pre-calibrated for the range of temperatures of operation.

Although in the present illustrative embodiment the amplitudes of the input and output signal levels have been compared in order to detect a fault condition, it will be apparent to those of ordinary skill in the art that other attributes of the input and output signal could be detected and compared in order to determine the presence of a fault in the predistorting linearizer circuit 2.

Figure 3:
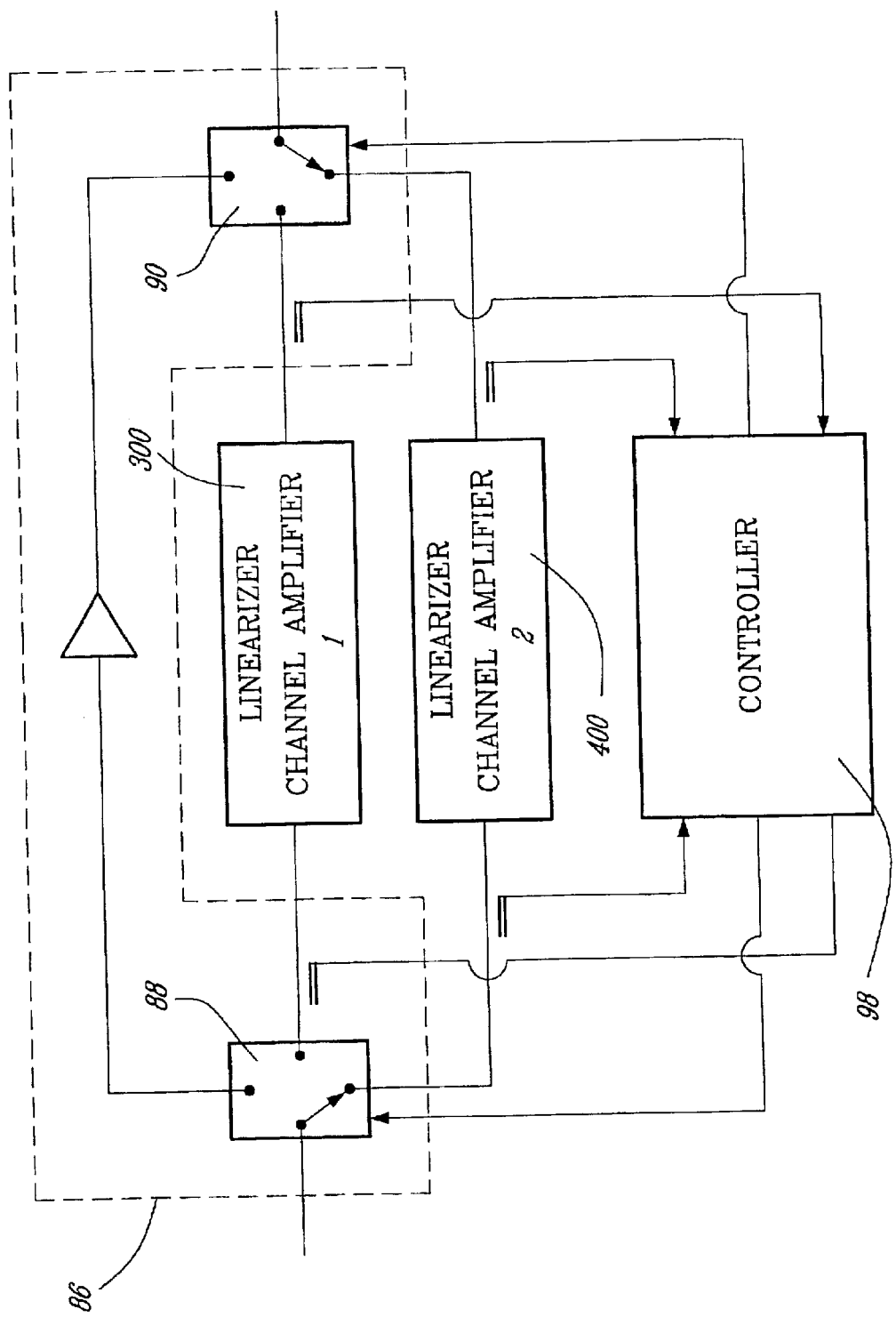
FIG. 3 is a circuit diagram of an illustrative embodiment of a fault tolerant predistorting circuit and agile bypass including two predistorting linearizer sections and an agile bypass circuit.

Referring now to FIG. 3, in a given configuration a plurality of predistorting linearizer channel amplifiers such as 300 and 400 are provided together with suitable input and output switches 88 and 90. A controller 98 provides for the predistorting linearizer channel amplifiers 300 or 400 to be hot swapped in instances of failure or maintenance without affecting the performance of the predistortion.

(c) The Controller Circuit

As the characteristics of a microwave power amplifier 6 may change significantly with temperature, the predistorting linearizer section 2 needs to follow changes in the amplifier 6 due to a variation in temperature in order to maintain the linearity of the system and therefore its overall performance. For this purpose, the controller circuit 98 is provided.

The controller circuit 98 comprises the processor 110 (CPU), a look-up table 112 stored in memory banks 114, an external interface 116, the digital-to-analog (D/A) converter 118, and the signal conditioner 120.

Figure 4A:
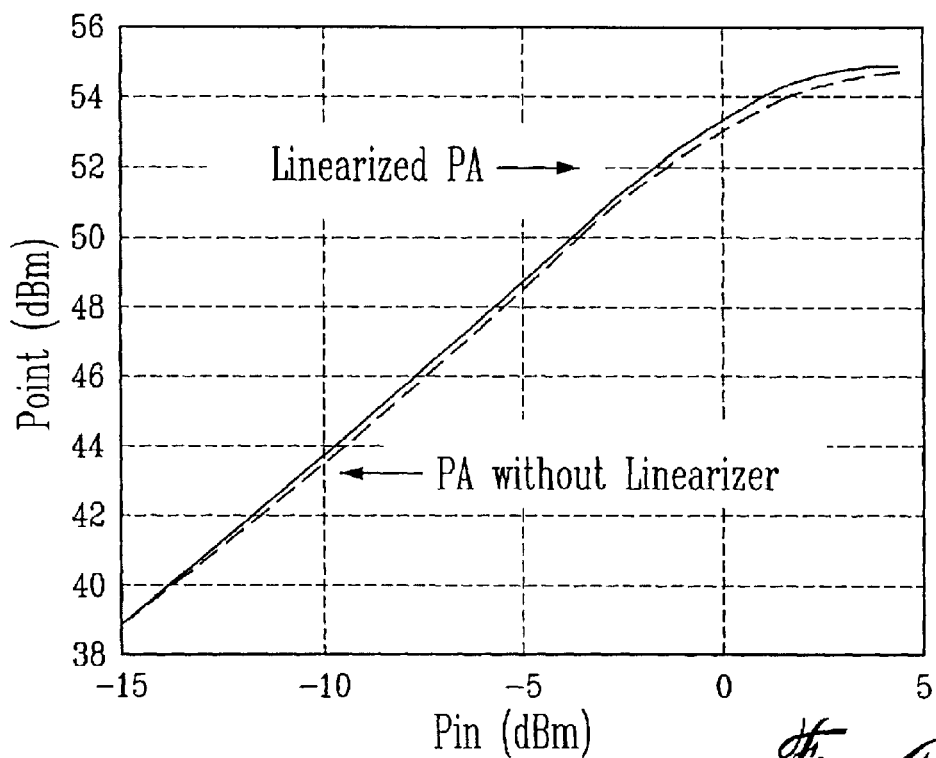
FIG. 4a is a graph showing the input power ($P_{in}$) versus the output power ($P_{out}$) response of a non-linearized versus a linearized power amplifier.
Figure 4B:
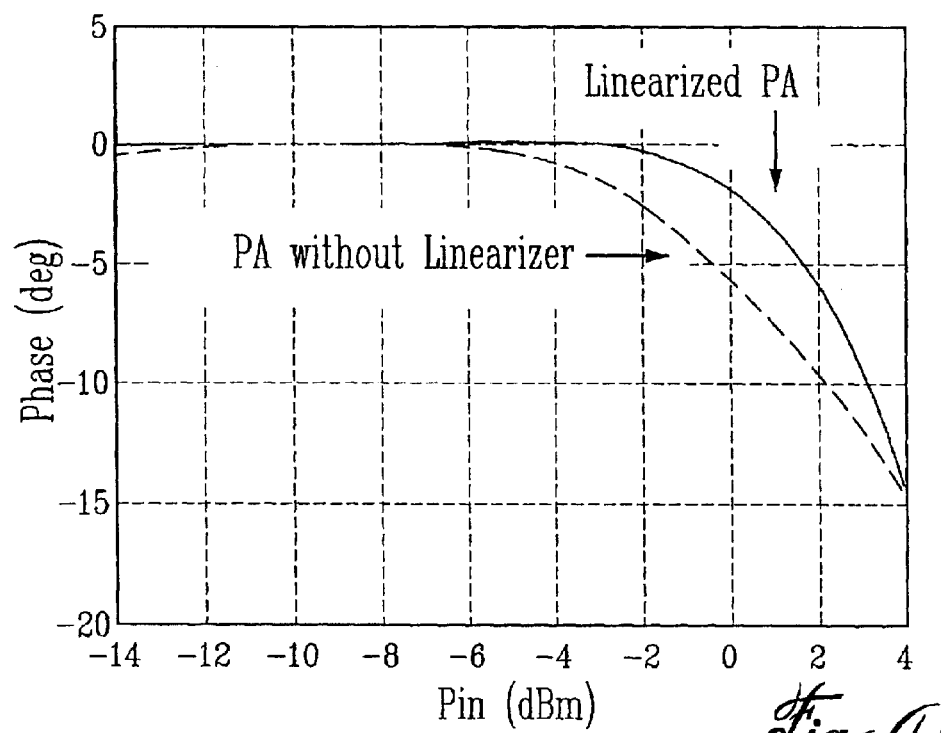
FIG. 4b is a graph showing $P_{in}$ versus Phase response of a non-linearized versus a linearized solid-state power amplifier.
Figure 4C:
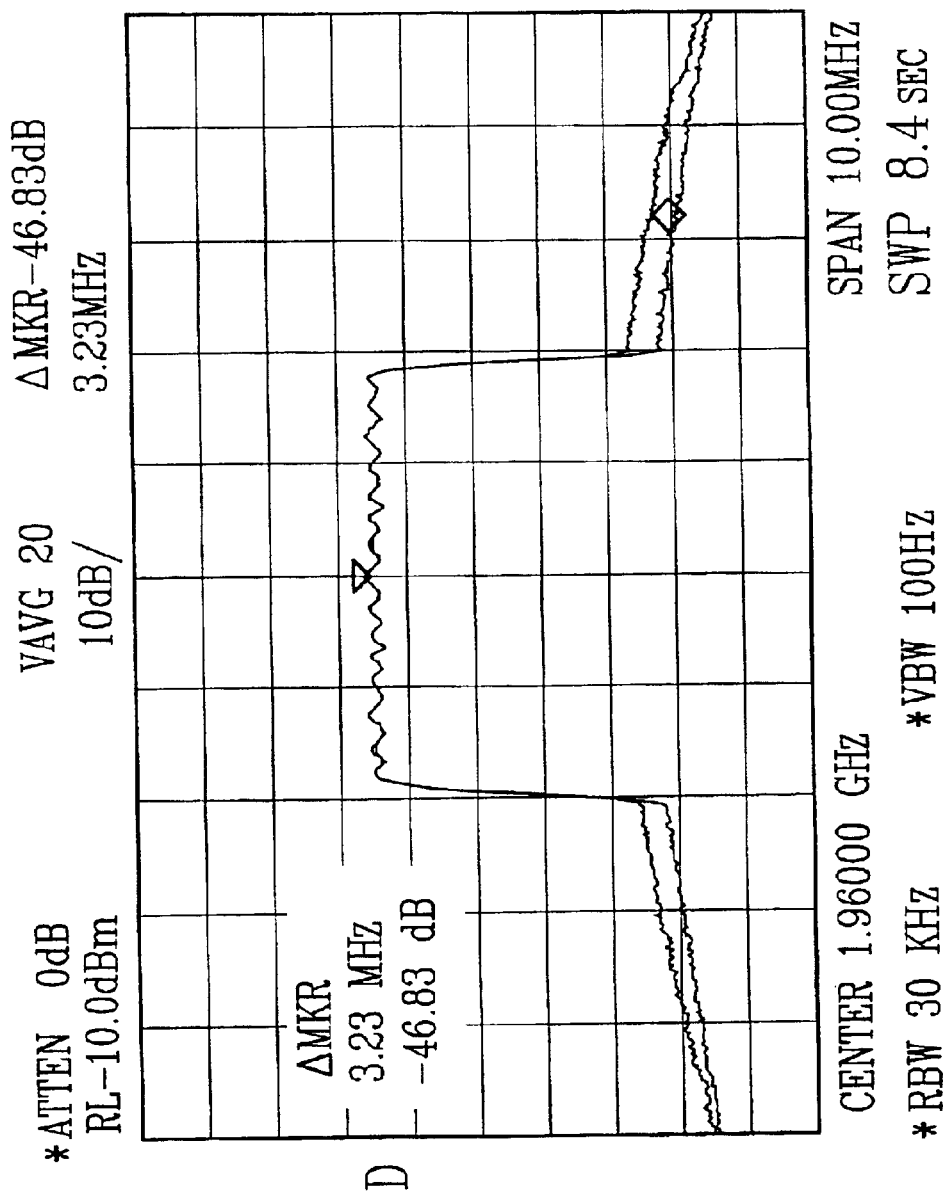
FIG. 4c is a graph showing the W-CDMA spectrum of a non-linearized versus a linearized solid-state power amplifier.

During the design stage of the predistorting linearizer section 2, a vector signal analyser (not shown) is used to measure the normalised gain versus the input power $P_{in}$ and the normalised phase shift versus the input power $P_{in}$ of the non-linearized power amplifier (see the curves in dashed line of FIGS. 4a and 4b). From the measured AM/AM and AM/PM curves of FIGS. 4a and 4b, a PC (Personal Computer) can be programmed for calculating ideal predistortion curves and corresponding predistortion control parameters to be applied to the predistorting linearizer section 2 in order to obtain the AM/AM or AM/PM curves closest to the ideal curves illustrated in solid lines in FIGS. 4a and 4b.

The problem of predistorting the input signal of the power amplifier 6 is essentially a complex curve-fitting problem having as objective function the complex gain of an ideal limiter for the power amplifier, not only as a problem of minimising the third order inter-modulation distortion products.

The derived predistortion control parameters are stored in the look-up table 112 for different temperatures of operation of the power amplifier 6. Of course, the predistortion control parameters stored in the look-up table 112 are suitable for controlling through the D/A converter 118 and the signal conditioner 120, the variable attenuator 10 through line 122, the variable attenuator 14 through line 124 and the controllable biasing-voltage supply 46 through line 126. This allows the predistorting linearizer section 2 to compensate for the non-linearities of a wide range of power amplifiers over a wide range of environmental conditions. Signal conditioner 120 is in fact a buffer circuit for interfacing the voltage level at the output of the D/A converter 118 with the voltage level of the diodes (or transistors) of the attenuators 10 and 14 and the predistorter 8, protecting both the D/A converter 118 and the diodes (or transistors).

Figure 5:
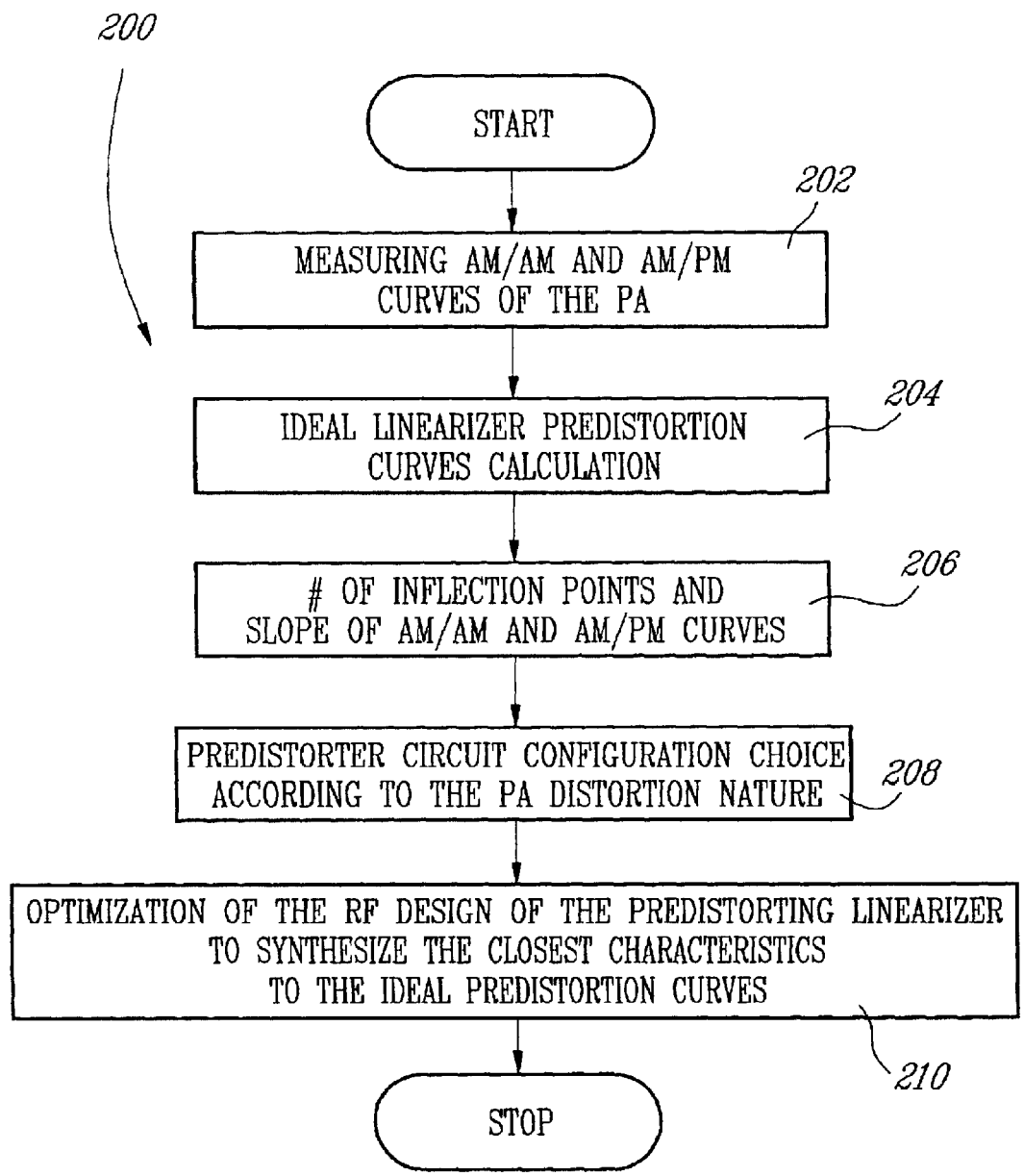
FIG. 5 is an illustrative embodiment of a flow chart that can be used for the design of a predistorting linearizer channel amplifier in accordance with the present invention.

FIG. 5 is a flow chart of an illustrative procedure for designing a predistorting linearizer channel amplifier 200 (FIG. 1). The first step 202 of this design procedure is to measure the AM/AM and AM/PM characteristics of the power amplifier 6. This can be done, for example, by analysing the power amplifier 6 with a Vector Network Analyser (VNA) while subjecting the power amplifier 6 to a variety of input signals and amplitudes.

At step 204, ideal linearizer predistortion curves are calculated. The ideal linearizer predistortion curves are generally represented as the inverse of AM/AM and AM/PM curves normalised relative to the small signal gain. By determining the number of inflection points and the slope of the downwardly extending portion of the AM/AM and AM/PM curves (also referred to as the distortion nature) (step 206), a user can choose (step 208) the configuration of the predistorter 8 from, for example, those proposed in FIGS. 2a to 2e. In an exemplary embodiment, for a power amplifier 6 showing only one inflection point in its AM/AM curve (usually seen in TWTAs), predistorter 8 comprising diodes (FIGS. 2a–2d) produces the desired results. If the slope in the AM/AM curve is abrupt, predistorter circuits of FIGS. 2a–2c will be chosen. If the slope is not abrupt, the predistorter circuit of FIG. 2d will provide a better choice. For a power amplifier 6 showing more than one inflection point in its AM/AM curve (usually seen in SSPAs), predistorter 8 circuits comprising transistors (FIG. 2e) produce desired results.

In the last design step (step 210), optimization of the design of the RF components of the predistorting linearizer section 2 (i.e., the predistorter 8 and its components (see FIGS. 2a to 2e); the attenuators 10 and 14 and their components and the amplifiers 12 and 16 (see FIG. 1) is conducted in order to synthesise the characteristics closest to the ideal predistortion curves over the required temperature range is carried out.

Figure 6:
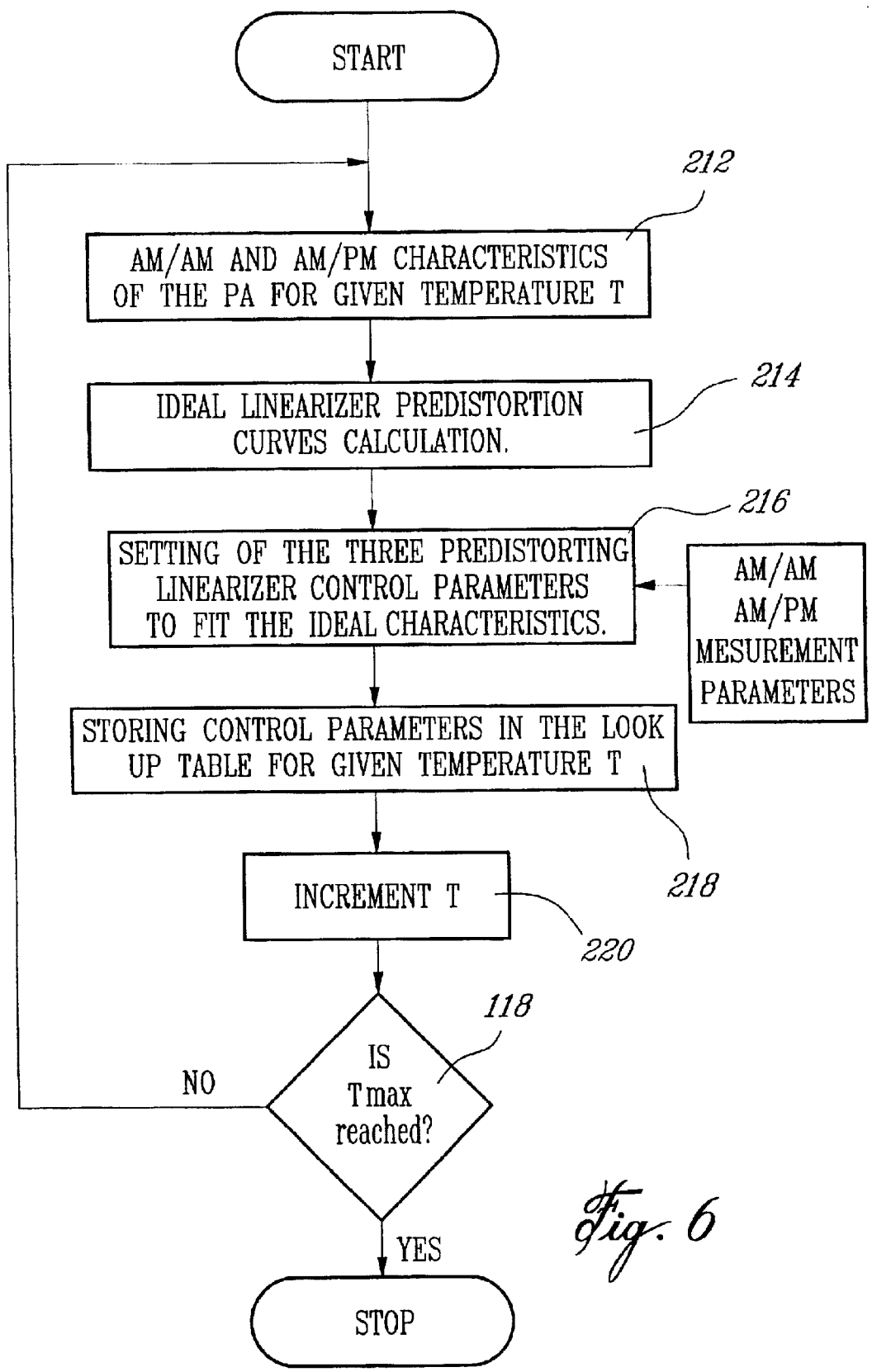
FIG. 6 is an illustrative embodiment of a flow chart that can be used for the alignment/calibration of a predistorting linearizer channel amplifier in accordance with the present invention.

FIG. 6 is a block diagram of the alignment/calibration procedure of the predistorting linearizer channel amplifier 200. The first step 212 in the alignment/calibration of the linearizer channel amplifier 200 consists of measuring the AM/AM and AM/PM characteristics of the power amplifier 6 for an initial temperature $T_i$. The initial temperature $T_i$ (for example, the lowest temperature of a given temperature range) as well as $T_{max}$ (for example, the highest temperature of the given temperature range) are chosen on the basis of the particular temperature specifications in which the predistorter will be used. The temperature range could be, as a non limitative example, −30° C. to 80° C. for military applications.

At step 214, ideal linearizer predistortion curves are calculated based on the measured AM/AM and AM/PM curves. The ideal linearizer predistortion curves are generally represented as the inverse of these measured AM/AM and AM/PM curves.

The three control parameters of the predistorting linearizer section 2 for controlling the predistorter 8 and the variable attenuators 10 and 14 are set, i.e. calibrated at step 216 for $T_i$ to fit the ideal linearizer predistortion curves. In order to perform these calibrations, the RF design parameters 217 are used (i.e. the measured AM/AM and AM/PM curves).

At step 218, the control parameters for $T_i$ are stored in look-up table 112. Temperature $T_i$ is then incremented (step 220) and, at step 222, it is determined whether $T_{max}$ is reached. If it is not, the alignment/calibration procedure continues, returns to step 212, and performs the subsequent steps with a new temperature value T. When $T_{max}$ is reached, the procedure stops.

Other embodiments of steps 220 and 222 are possible. For example, the initial temperature $T_i$ could be the highest temperature of the temperature range and the temperature could be decremented until $T_{min}$ is reached. In another example, the temperature increments (step 220) could take on different values for each iteration depending on the rate of change, in relation to the change in temperature, of the AM/AM and AM/PM curves.

As shown in FIG. 1, it is possible to modify or monitor the alignment/calibration of the predistorting linearizer channel amplifier 200 through the external interface 116.

In operation, the processor (CPU) 110 measures the temperature $T_p$ of the power amplifier through the signal conditioner 120 and the D/A converter 118, selects predistortion control parameters from the look-up table 112 in relation to the measured temperature, and finally applies these predistortion parameters to the variable attenuators 10 and 14 and the predistorter 8 to linearize the output signal of the power amplifier 6, i.e. to produce a predistorted output signal 106 which cancels the distortion subsequently produced by the microwave power amplifier 6.

Therefore, the function of the controller circuit 98 is to provide a set of predistortion control parameters for controlling the biasing voltages $V_a$ of the attenuators 10 and 14, and the biasing voltage $V_p$ of the predistorter 8 in relation to the temperature of operation of the power amplifier 6. Controller circuit 98 can be a FPGA (Fast Programmable Gate Array), a DSP (Digital Signal Processor) or a PIC (Programmable Integrated Controller), etc., and can be interfaced with a PC (Personal Computer) through the external interface 116 to automatically adjust the predistortion curves directly. The processor 110 (CPU) may include a program that tries to maintain good linearity of the linearized power amplifier 6 over a wide range of environmental conditions, operating conditions or type of input signals (for example CDMA, QPSK, BPSK, nQAM, etc.).

The foregoing illustrative embodiment has been described in relation to control of the predistorting linearizer section 2 in response to temperature. However, it will be understood by those of ordinary skill in the art that such control can be made in relation to other environmental operating conditions affecting the linearity of the microwave power amplifier 6.

Also, application of the concept of the present invention is not limited to microwave power amplifiers but to any other type of amplifier requiring compensation for environmental conditions affecting distortion produced by the amplifier, and therefore linearity of the amplifier.

For example, in state of the art base band optical transmission systems an RF signal is used to modulate a laser light source. At high transmission power the optical signal becomes compressed by the optical system. By predistorting the RF signal, distortion introduced by the optical system can be compensated for, thereby yielding an increased Signal-to-Noise Ratio (SNR) and better transmission performance.

The results shown in FIGS. 7a, 7b, 7c and 7d concern a TWTA working at C-band frequencies but are typical for any improvement in TWTA linearity using the present invention.

Figure 7A:
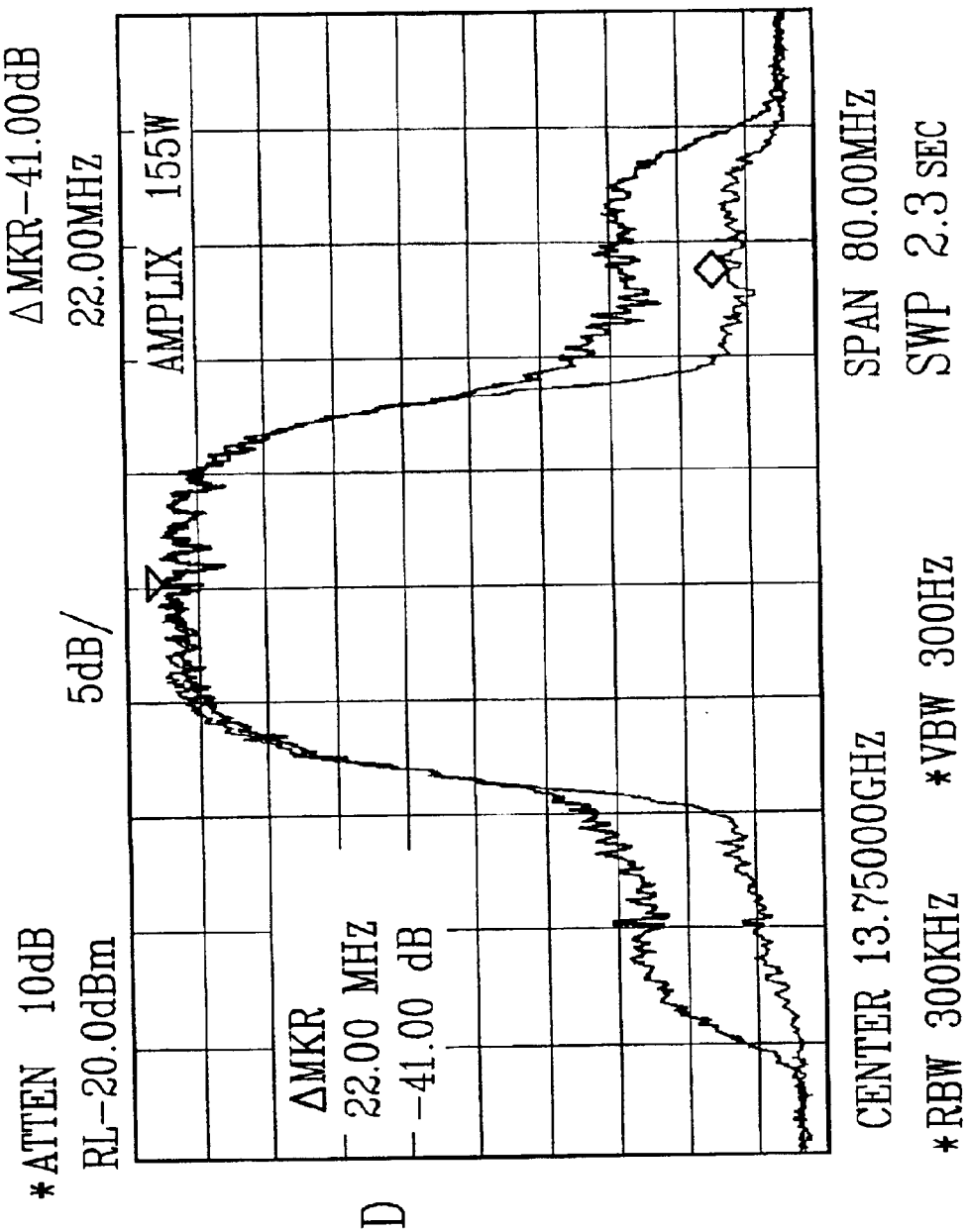
FIG. 7a is the frequency spectrum measured at the output of a TWTA (Travelling Wave Tube Amplifier) and a predistorted TWTA both driven by a 22 MHz QPSK signal.

Referring to FIG. 7a, the spectrum at the output of the TWTA and the predistorted TWTA both driven by a 22 MHz QPSK signal is shown. An improvement of over approximately 8 dB was achieved on the third order adjacent channel power ratio (ACPR).

Figure 7B:
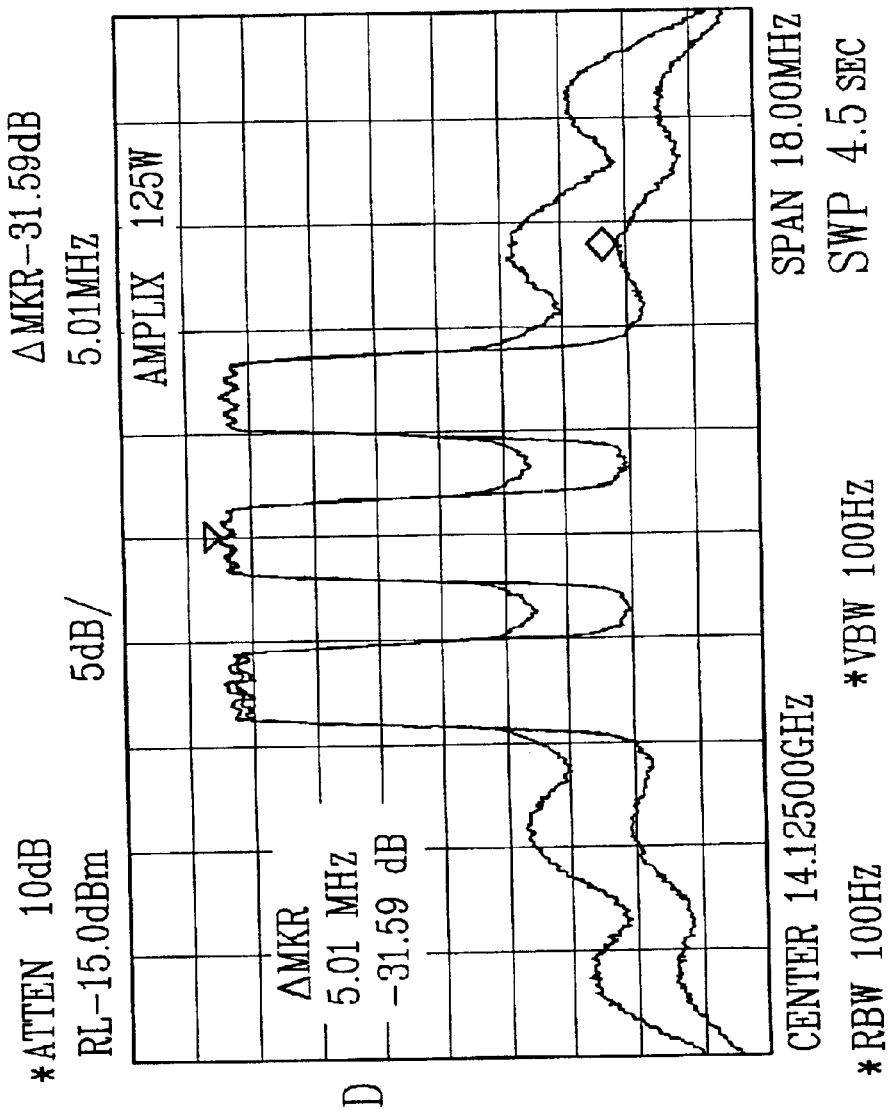
FIG. 7b is the frequency spectrum measured at the output of a TWTA and a predistorted TWTA both driven by a CDMA Multi carrier signal.

Referring now to FIG. 7b, the spectrum at the output of the TWTA and the predistorted TWTA both driven by 3 CDMA multi-carrier signal is shown. An improvement of approximately 10 dB was achieved on the third order adjacent channel power ratio (ACPR).

Figure 7C:
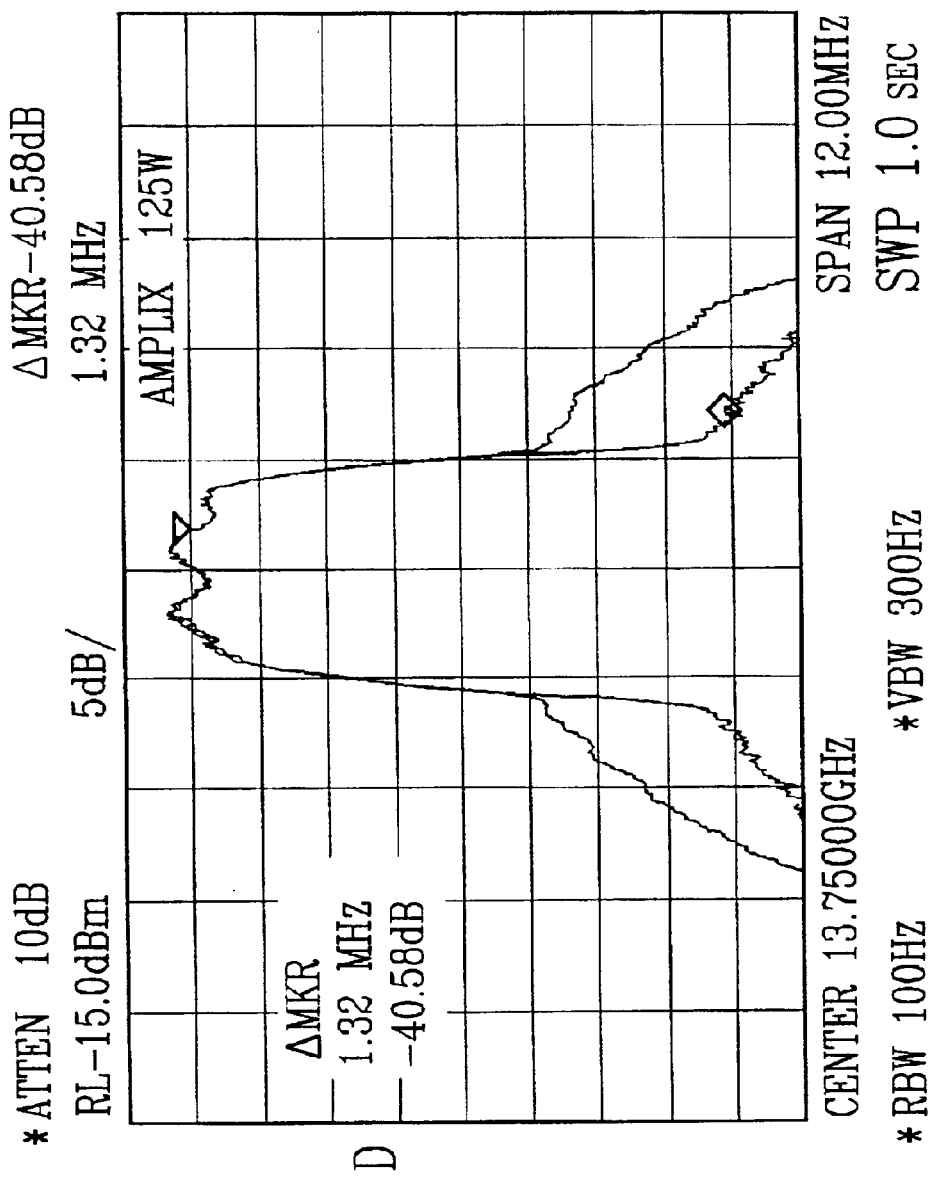
FIG. 7c is the frequency spectrum measured at the output of a TWTA and a predistorted TWTA both driven by a 2.4 MHz 16QAM signal.

Referring to FIG. 7c, the spectrum at the output of the TWTA and the predistorted TWTA both driven by a 2.4 MHz 16QAM signal is shown. An improvement of over approximately over 10 dB was achieved on the third order adjacent channel power ratio (ACPR).

Figure 7D:
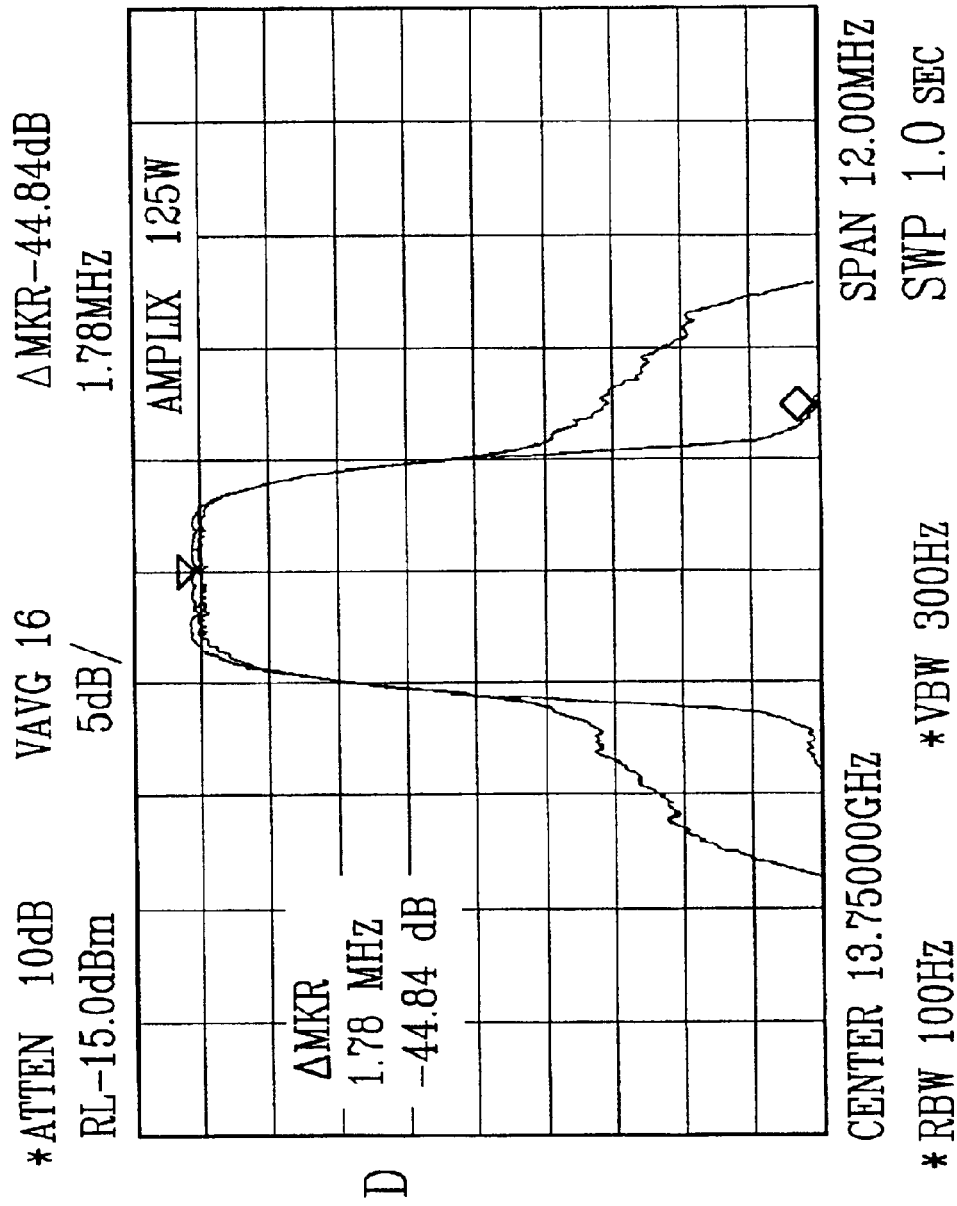
FIG. 7d is the frequency spectrum measured at the output of a TWTA and a predistorted TWTA both driven by a 2.4 MHz BPSK signal.

Referring to FIG. 7d, the spectrum at the output of the TWTA and the predistorted TWTA both driven by a 2.4 MHz BPSK signal is shown. An improvement of over approximately over 15 dB was achieved on the third order adjacent channel power ratio (ACPR).

Although the present invention has been described hereinabove by way of illustrative embodiments thereof, these embodiments can be modified at will, within the scope of the appended claims, without departing from the spirit and nature of the subject invention.

What is claimed is:

1. An open loop predistorter for predistorting a RF signal subsequently injected in an amplifier, comprising:

a hybrid coupler comprising a RF input constituting an input of the predistorter supplied with the RF signal, a RF output constituting an output of the predistorter for supplying a predistorted version of the RF signal, a direct port, and a coupled port;

a first diode having an anode connected to said direct port and a cathode connected to the ground;

a second diode having an anode connected to said coupled port and a cathode connected to the ground; and a controllable biasing-voltage supply connected to said direct port and to said coupled port, thereby supplying said direct and coupled ports with a controllable biasing voltage;

wherein, in operation, said open loon predistorter produces a controllable predistortion of the RF signal related to the controllable biasing voltage to cancel a distortion subsequently produced by the amplifier.

2. The open loop predistorter as defined in claim 1, further comprising a first inductor interposed between the controllable biasing-voltage supply and the direct port and a second inductor interposed between said controllable biasing-voltage supply and the coupled port.

3. The open loop predistorter as in claim 1 further comprising a first matching circuit interposed between the direct port and the anode of the first diode and a second matching circuit interposed between the coupled port and the anode of the second diode.

4. The open loop predistorter as defined in claim 3, wherein the first and second matching circuits are matching line circuits.

5. The open loop predistorter as defined in claim 1, wherein said first and second diodes are Schottky diodes.

6. The open loop predistorter as defined in claim 1, wherein said controllable predistortion of the RF signal can be bypassed by setting said controllable biasing voltage to below an operational threshold.

7. A predistorting linearizer channel amplifier for processing an input signal subsequently supplied to a power amplifier, comprising:

a controllable input variable-attenuator and drive-amplifier circuit supplied with the input signal to attenuate and amplify said input signal;

a predistorter comprising a controllable phase-shifting and amplitude-adjusting path supplied with the attenuated and amplified input signal to distort said attenuated and amplified input signal and produce a predistorted output signal;

a controllable output variable-attenuator and drive-amplifier circuit supplied with the predistorted output signal to attenuate and amplify the predistorted output signal before supplying said predistorted output signal to the power amplifier;

a phase-shifting and amplitude-adjusting controller connected to the controllable input variable-attenuator and drive-amplifier circuit, the controllable phase-shifting and amplitude-adjusting path, and the controllable output variable-attenuator and drive-amplifier circuit; and a bypass extending in parallel with the series circuit including the serially interconnected input variable-attenuator and drive-amplifier circuit, controllable phase-shifting and amplitude-adjusting path, and output variable-attenuator and drive-amplifier circuit, said bypass defining a bypass circuit established in response to a fault condition in said series circuit to bypass the faulty series circuit.

8. A predistorting linearizer channel amplifier as defined in claim 7, wherein:

the controllable input variable-attenuator and drive-amplifier circuit comprises a first controllable variable attenuator and an input drive amplifier connected in series; and the controllable output variable-attenuator and drive-amplifier circuit comprises a second controllable variable attenuator and an output drive amplifier connected in series.

9. A predistorting linearizer channel amplifier as recited in claim 7, further comprising:

a main input supplied with the input signal;

a main output to deliver the attenuated and amplified predistorted output signal to the power amplifier;

said bypass comprising:

a signal amplifier having an input and an output;

a controllable input switch interposed between the main Input, an input of the input variable-attenuator and drive-amplifier circuit, and the input of the signal amplifier, said input switch having a first position defining a conductive path between the main input and the input of the input variable-attenuator and drive-amplifier circuit and a second position defining a conductive path between the main input and the input of the signal amplifier;

a controllable output switch interposed between an output of the output variable-attenuator and drive-amplifier circuit, the output of the signal amplifier, and the main output, said output switch having a first position defining a conductive path between the output of the output variable-attenuator and drive-amplifier circuit and the main output, and a second position defining a conductive path between the output of the signal amplifier and the main output; and an input and output switch control responsive to said fault and connected to both said input and output switches.

10. A predistorting linearizer channel amplifier as defined in claim 9, wherein the input and output switch control comprises a detector of said input signal, an attenuated and amplified predistorted output signal detector, a comparator of the input and output signals detected by said signal detectors, a fault condition detector responsive to the comparison between the detected input and output signals, and a switching control unit interposed between the fault condition detector and the input and output switches.

* * * * *